(12) United States Patent
Stolpman

(10) Patent No.: US 7,782,150 B2
(45) Date of Patent: *Aug. 24, 2010

(54) APPARATUS AND METHOD OF TEMPERATURE COMPENSATING AN OVENIZED OSCILLATOR

(75) Inventor: James L. Stolpman, Bloomingdale, IL (US)

(73) Assignee: CTS Corporation, Elkhart, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/321,718

(22) Filed: Jan. 23, 2009

(65) Prior Publication Data

US 2009/0128246 A1  May 21, 2009

Related U.S. Application Data

(63) Continuation of application No. 11/476,359, filed on Jun. 28, 2006, now Pat. No. 7,482,889.

(51) Int. Cl.
 *H03L 1/02* (2006.01)
(52) U.S. Cl. .............. 331/176; 331/116 R; 331/158
(58) Field of Classification Search .............. 331/65, 331/66, 68, 69, 70, 116 R, 116 FE, 154, 158, 331/160, 175, 176
See application file for complete search history.

(56) References Cited

U.S. PATENT DOCUMENTS

| | | | |
|---|---|---|---|
| 5,691,671 A | 11/1997 | Bushman | |
| 6,362,699 B1 | 3/2002 | Fry | |
| 6,362,700 B1 | 3/2002 | Fry | |
| 6,501,340 B1 | 12/2002 | Flood | |
| 6,545,550 B1 | 4/2003 | Frerking | |
| 6,870,430 B2 | 3/2005 | Nakamura et al. | |
| 7,403,078 B2* | 7/2008 | Routama et al. | 331/176 |
| 2003/0197567 A1 | 10/2003 | Vilella | |
| 2006/0012446 A1 | 1/2006 | Hardy et al. | |
| 2006/0132254 A1 | 6/2006 | Routama et al. | |

OTHER PUBLICATIONS

Micro Analog Systems Oy (MAS), 12=8 Bit D to A Converter, part specification and description, Feb. 23, 2005, pp. 1-10, Micro Analog Systems Oy, Espoo, Finland.

Bob Parkins, Sales Manager, Lap-Tech Inc., Stress Compensated Quartz Resonators, article reprinted from EP&T Magazine, Jan.-Feb. 2005, Lap-Tech Inc., Bowmanville, Ontario, Canada.

Mark A. Haney, Design Technique for Analog Temperature Compensation of Crystal Oscillators, thesis submitted to the faculty of the Virginia Polytechnic Institute and State University, copyright 2001, pp. i-vii and 9-55, Mark Haney, Blacksburg, Virginia, U.S.A.

(Continued)

*Primary Examiner*—Robert Pascal
*Assistant Examiner*—Ryan Johnson
(74) *Attorney, Agent, or Firm*—Daniel J. Deneufbourg

(57) ABSTRACT

An oscillator having improved frequency stability which includes an oscillator circuit and an SC-cut resonator connected with the oscillator circuit. The SC-cut resonator has a first turning point. A temperature compensation circuit is connected with the oscillator circuit. The temperature compensation circuit is adapted to adjust a reference frequency generated by the oscillator circuit according to a frequency response associated with a second turning point of an AT-cut resonator.

15 Claims, 9 Drawing Sheets

OTHER PUBLICATIONS

Kahn, Klaus-Dieter, PCT International Search Report mailed: Apr. 15, 2008 re International Application No. PCT/US2007/013890 filed Jun. 13, 2007.

Kahn, Klaus-Dieter, PCT Written Opinion of the International Searching Authority mailed: Apr. 15, 2008 re International Application No. PCT/US2007/013890 filed Jun. 13, 2007.

* cited by examiner

APPARATUS AND METHOD OF TEMPERATURE COMPENSATING AN OVENIZED OSCILLATOR

CROSS-REFERENCE TO RELATED APPLICATIONS

This application is a continuation application which claims the benefit of U.S. patent application Ser. No. 11/476,359 filed on Jun. 28, 2006 now U.S. Pat. No. 7,482,889, entitled Apparatus and Method of Temperature Compensating an Ovenized Oscillator, the disclosure of which is explicitly incorporated by reference, as are all references cited therein.

TECHNICAL FIELD

This invention relates to oscillators that provide a stable reference frequency signal in electronic equipment and, more specifically, to a temperature compensated crystal oscillator that is contained within an ovenized enclosure and that compensates only a portion of a Bechmann curve of frequency change with temperature.

BACKGROUND OF THE INVENTION

Various devices are well known for providing a reference frequency or source. Such devices are called oscillators and typically incorporate a quartz crystal or other type of resonator and electronic compensation circuitry to stabilize the output frequency.

Various methods are known to stabilize the output frequency as the temperature of the oscillator changes. Temperature compensated crystal oscillators (TCXOs) typically employ a thermistor network to generate a correction voltage which reduces the frequency variation over temperature. The correction voltage is usually applied to a varactor diode in the crystal circuit such that the crystal frequency may be varied by a small amount. TCXO stability can approach 0.1 PPM but several problems must be addressed.

A TCXO that resides at one temperature extreme for an extended period of time may exhibit a frequency shift when returned to normal room temperature.

Usually this hysteresis or "retrace" error is temporary but a seemingly permanent offset is common. Retrace errors are usually less than about 0.1 PPM but can be much higher, especially if the mechanical tuning device (trimmer capacitor or potentiometer) is shifting. This hysteresis makes the manufacture of TCXOs with specifications approaching 0.1 PPM quite difficult. The high precision crystals found in oven oscillators exhibit less retrace but they are unsuitable for use in TCXOs because they often exhibit activity dips at temperatures below the designed oven temperature.

Further SC-cut and high overtone type crystals cannot be tuned by a sufficient amount to compensate for the frequency excursion with temperature. In addition, SC-cut crystals are very expensive.

TCXOs are preferred to oven oscillators in low power applications and where a warm-up period is not acceptable. The only warm-up time is the time required for the components to reach thermal equilibrium and the total current consumption can be very low—often determined by the output signal power requirements. Older TCXO designs employ from one to three thermistors to flatten the crystal temperature frequency curve. Newer designs employ digital logic or a microprocessor to derive a correction voltage from values or coefficients stored in memory.

Ovenized oscillators heat the temperature-sensitive portions of the oscillator which are isolated from the ambient to a uniform temperature to obtain a more stable output. Ovenized oscillators contain a heater, a temperature sensor and circuitry to control the heater. The temperature control circuitry holds the crystal and critical circuitry at a precise, constant temperature. The best controllers are proportional, i.e., providing a steady heating current which changes with the ambient temperature to hold the oven at a precise setpoint, usually about 10 degrees above the highest expected ambient temperature.

Temperature-induced frequency variations can be greatly reduced by an amount approaching the thermal gain of the oven. The crystal for the oven is selected to have a "turning-point" at or near the oven temperature, further reducing the sensitivity to temperature. The combination of the high oven gain with operation near the turning point yields temperature stabilities approaching 0.0001 PPM over a temperature range that would cause the crystal to change by 10 PPM.

Highly polished, high-Q crystals which often have significant activity dips may be designed with no activity dips near the operating temperature, providing better stability and phase noise than crystals designed for wide temperature ranges. Ovenized oscillators allow the use of SC-cut crystals which offer superior characteristics but which are impractical for ordinary TCXOs because of their steep frequency drop at cooler temperatures. Unfortunately, SC-cut crystals are much more expensive to produce than AT-cut crystals typically used in TCXOs.

Oven oscillators have a higher power consumption than temperature compensated oscillators. Oven oscillators require a few minutes to warm up, and the power consumption is typically one or two watts at room temperature. SC-cut crystals stabilize as soon as they reach the operating temperature, but AT-cut crystals exhibit a significant thermal transient effect, which can take many minutes to settle. A typical AT-cut crystal will drop in frequency well below any point on the static crystal curve due to the sudden application of oven heat. In most oscillators, the frequency will exponentially drift back up to the nominal frequency.

In some designs, the oven controller overshoots significantly during initial warm-up and then cools back down to the final oven temperature. This cooling transient can kick the AT-cut crystal in the other direction and may actually result in a shorter warm-up time even though the controller takes longer to settle. Hand-tweaked designs can achieve fairly acceptable warm-up times with carefully selected overshoot, but the advent of quick-settling SC-cut crystals has made this approach obsolete.

Despite the advantages of prior art oscillators, an unmet need exists for an oscillator that has improved frequency stability over temperature and time and that can be manufactured at a reasonable cost.

SUMMARY OF THE INVENTION

It is a feature of the invention to provide an oscillator that includes an oscillator circuit and a resonator connected with the oscillator circuit. The resonator has a first turning point. A temperature compensation circuit is connected with the oscillator circuit. The temperature compensation circuit is adapted to adjust a reference frequency generated by the oscillator circuit according to a frequency response associated with a second turning point.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, nor is it intended to be limiting as to the scope of the invention in any way.

BRIEF DESCRIPTION OF THE FIGURES

These and other features of the invention can best be understood by the description of the accompanying drawings as follows.

It is noted that the drawings of the invention are not to scale. The invention will be described with additional specificity and detail through the accompanying drawings.

DETAILED DESCRIPTION OF THE PREFERRED EMBODIMENTS

Figure 1:
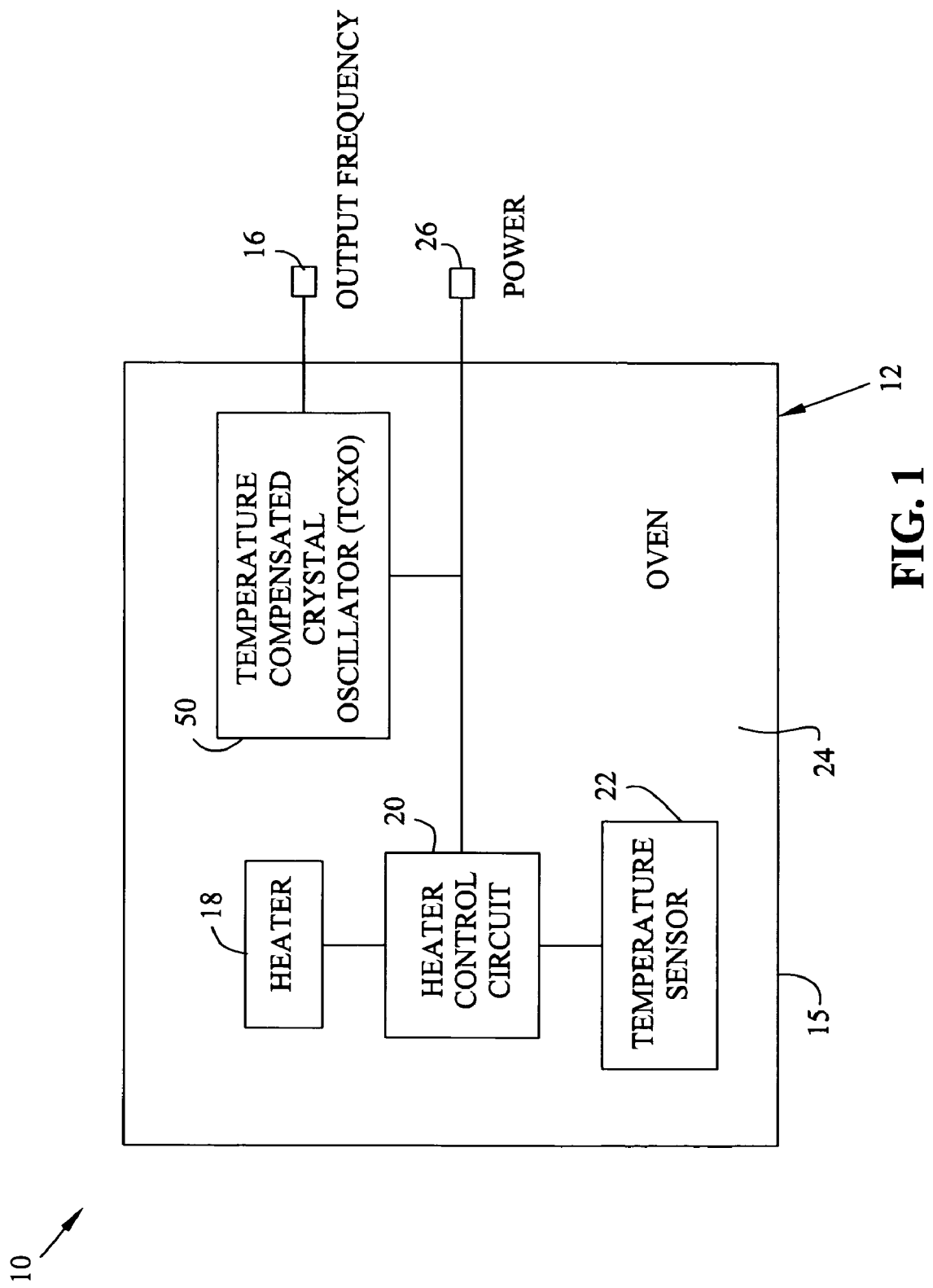
FIG. 1 is a diagrammatic view of a temperature compensated crystal oscillator (TCXO) located inside a temperature controlled oven in accordance with the present invention.

Referring to FIG. 1, a diagrammatic view of a temperature compensated crystal oscillator (TCXO) located inside a temperature controlled oven is shown. Oscillator assembly 10 includes an oven 12 which contains the oscillator components. Oven 12 can include a metal housing 14 with a cavity 15 that contains foam insulation 24. A temperature compensated crystal oscillator (TCXO) 50 is located inside oven 12. TCXO 50 can be any type of oscillator that uses any type of resonator. For example, TCXO 50 can be a Colpitts oscillator using an AT-cut quartz crystal resonator. TCXO 50 generates and provides a stable reference frequency at output terminal 16.

A heater 18 is located in oven 12. Heater 18 is typically a transistor in which the dissipated power is proportionally controlled to heat and maintain a constant temperature inside oven 12. A temperature sensor 22 is located inside housing 14. Sensor 22 is a negative-coefficient conventional thermistor. The temperature sensor monitors the temperature of TCXO 50.

Connected to sensor 22 and heater 18 is a control circuit 20 which controls heater 18. Control circuit 20 receives a temperature signal as an input from sensor 22 and provides a heater control signal as an output to heater 18. When the temperature falls below the selected setpoint for the oven, control circuit 20 increases power to heater 18 to increase the temperature in oven 12. When the temperature is above the setpoint for the oven, control circuit 20 reduces power to heater 18 to allow a decrease in the temperature in oven 12.

Power is applied to the oscillator assembly through terminal 26. Terminal 26 is connected with TCXO 50 and the heater control circuit 20.

Oven 12 can be a single oven or a double oven. Oven 12 may include an evacuated region in order to improve the temperature performance of the oscillator.

Oscillator assembly 10 can be operated where the operation of TCXO 50 is optimized for temperatures around the setpoint of the oven and has a frequency stability of about 20 PPB. Oven 12 will consume approximately 1 watt of power during operation.

Oscillator Circuit

Figure 2:
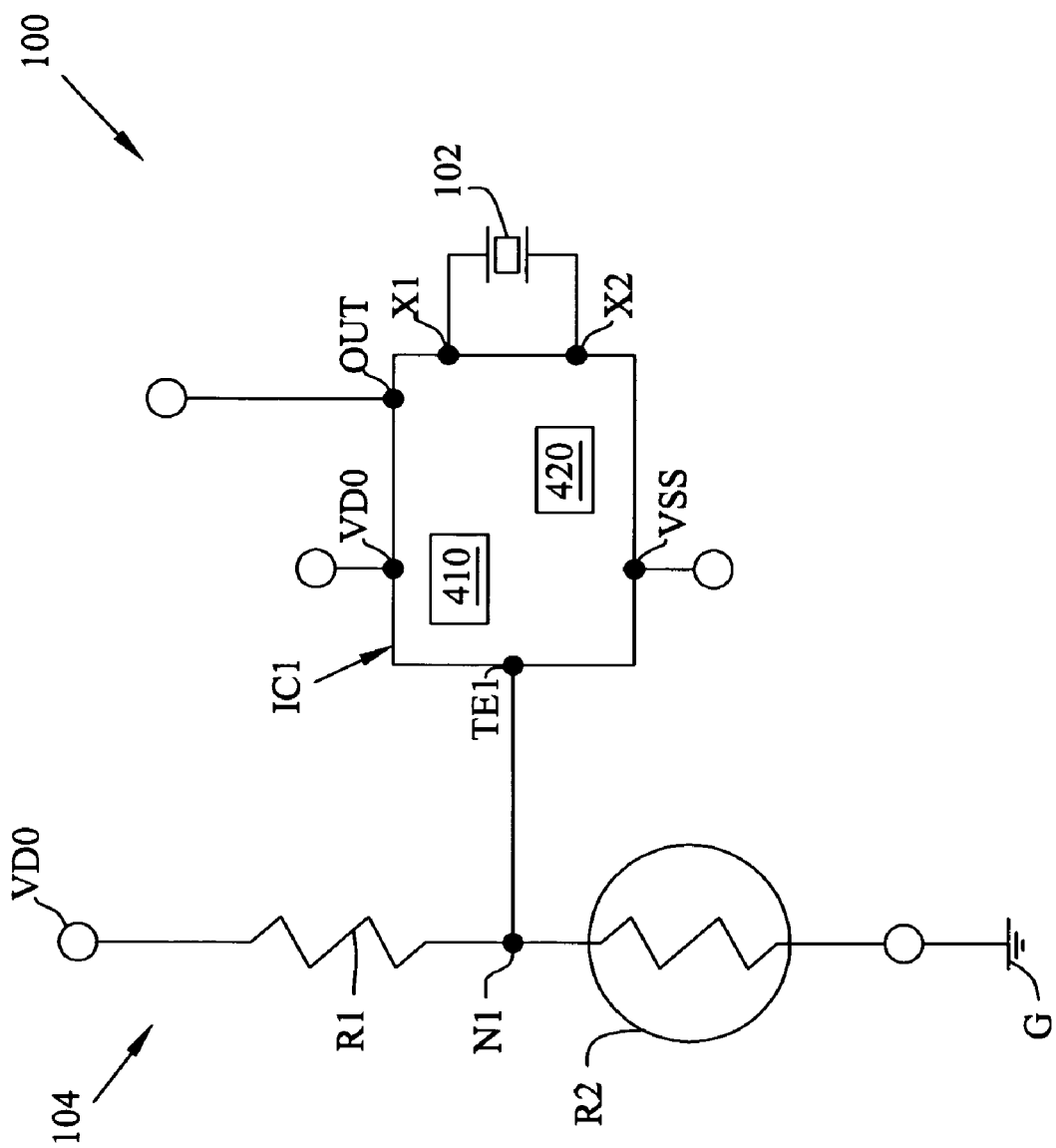
FIG. 2 is a schematic view of one embodiment of a TCXO in accordance with the present invention.

Referring to FIG. 2, a schematic diagram of an embodiment of a temperature compensated crystal oscillator (TCXO) 100 in accordance with the present invention is shown. TCXO 100 can replace TCXO 50 of FIG. 1. TCXO 100 is adapted to be mounted in oven 12. TCXO 100 includes a temperature compensation integrated circuit IC1. Integrated circuit IC1 can be designed for use with oscillators including, for example, part number MAS9279 integrated circuit that is commercially available from Micro Analog Systems Oy of Espoo, Finland. Integrated circuit IC1 is optimized for use with an AT-cut quartz crystal. Integrated circuit IC1 is produced in large quantities and therefore can be purchased at a reasonable cost. Integrated circuit IC1 can contain an oscillator circuit 410 and a temperature compensation circuit 420. Integrated circuit IC1 can operate as a TCXO with only the addition of a resonator or crystal.

Integrated circuit IC1 includes terminals Vdd, Out, X1, X2, Vss, and TE1. Terminal Vdd is connected with a 3.3 volt power source and terminal Vss is connected to ground. Crystal terminals X1 and X2 are connected across the resonator 102, which typically is a quartz crystal. Resonator 102 preferably is an SC-cut quartz crystal. Resonator 102 could also be a mesa-type crystal or other bulk resonator such as lithium niobate. Terminal TE1 is the temperature input/output terminal. Terminal Out is the reference frequency output terminal.

An external temperature sensor 104 is connected with terminal TE1. A temperature sensor (not shown) is also located within integrated circuit IC1, but is not used in this embodiment. Temperature sensor 104 is mounted in close proximity to resonator 102. Temperature sensor 104 includes a pair of serial connected resistors R1 and R2 that are connected at node N1. Resistor R2 is a thermistor that changes resistance with temperature. Resistor R1 is a fixed resistor. One end or resistor R2 is connected to node N1 and the other end is connected to ground. One end of resistor R1 is connected to power source Vdd and the other end is connected to node N1. Node N1 is connected to terminal TE1.

During the operation of the oscillator with TCXO 100, oven 12 is maintained at a substantially constant temperature by sensor 22, heater 18 and control circuit 20. Integrated circuit IC1 contains oscillator circuit 410 that produces the reference frequency that is stabilized by resonator 102. Temperature sensor 104 generates a temperature signal that is proportional to the temperature to which resonator 102 is exposed. The output voltage of temperature sensor 104 can be adjusted to a desired voltage range by the selection of appropriate values for resistors R1 and R2 and voltage Vdd.

Integrated circuit IC1 contains a temperature compensation circuit 420 that uses the temperature signal to adjust the reference frequency that is produced at terminal Out. The temperature compensation circuit maintains the reference frequency within a determined tolerance.

Figure 7:
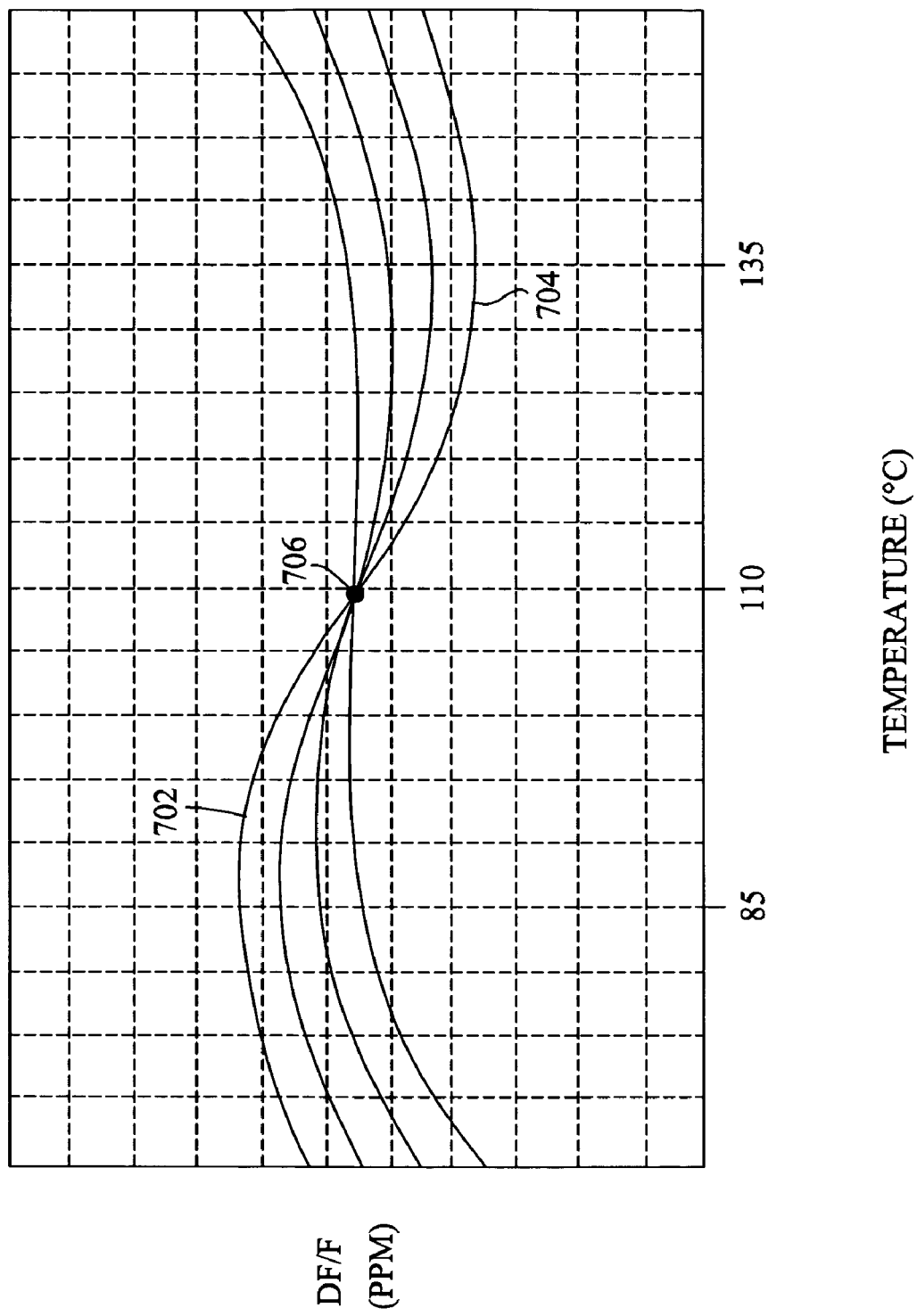
FIG. 7 is a graph of frequency change versus temperature for several SC-cut crystals at different cut angles.
Figure 8:
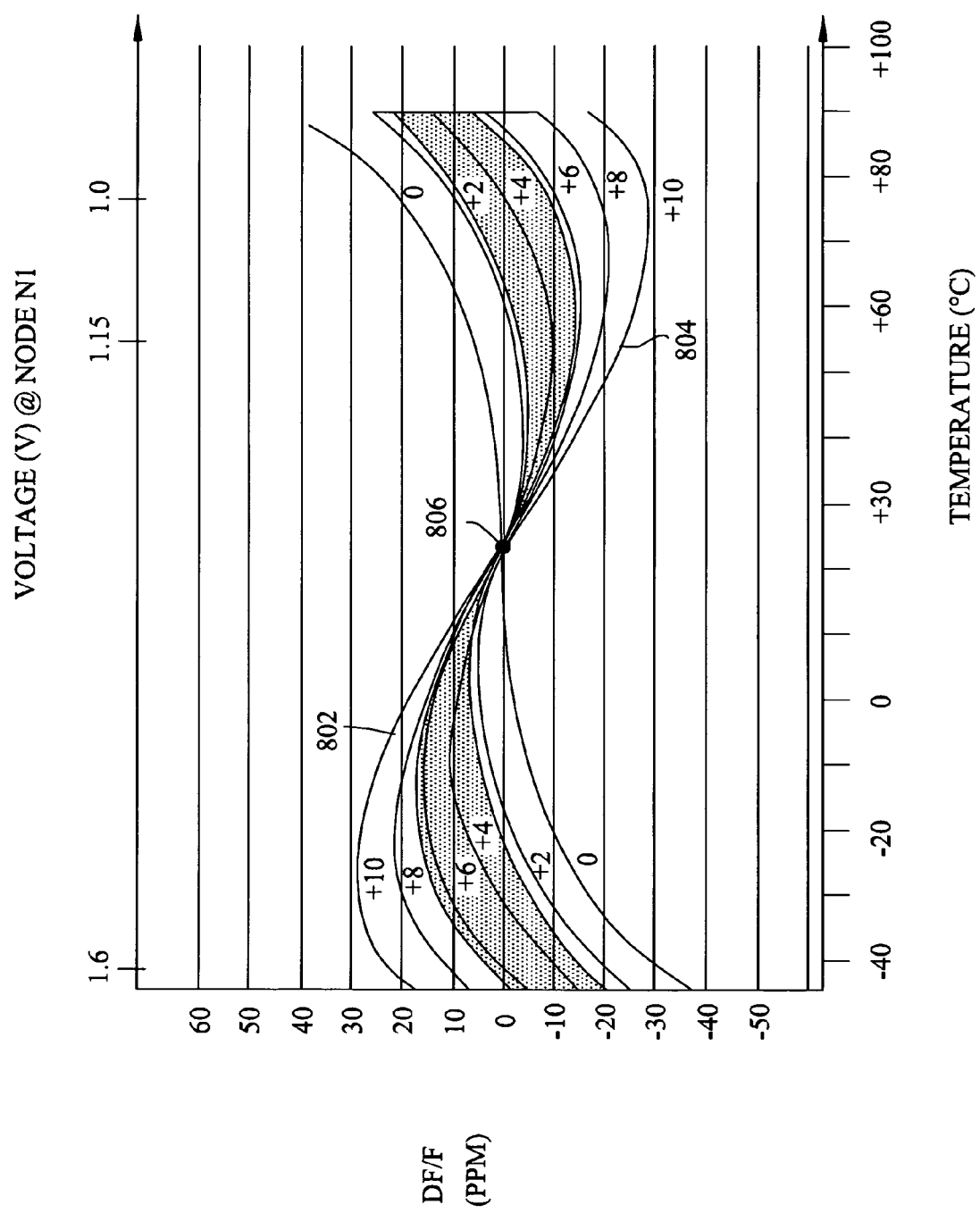
FIG. 8 is a graph of frequency change versus temperature for several AT-cut crystals at different cut angles.

Turning now to FIGS. 7 and 8, a graph of frequency change versus temperature, Bechmann curve for several SC-cut crystals at different cut angles is shown in FIG. 7 and a Bechmann curve for several AT-cut crystals at different cut angles is shown in FIG. 8. FIG. 7 shows that the rate of change of frequency with temperature for an SC-cut crystal is minimized by operating around the maximum 702 or minimum 704 values of the sinusoidal curve. This is called the turning point of the crystal. FIG. 7 also has an inflection point 706. In other words, the frequency response line has a small slope. For an SC-cut crystal, the preferred operating or oven setpoint temperature value typically is around 85 degrees Centigrade.

Integrated circuit IC1 is designed to compensate the frequency change versus temperature curve for an AT-cut crystal shown in FIG. 8. FIG. 8 has turning points 802 and 804 and an inflection point 806. It is noted that if an SC-cut crystal is operated at the SC-cut turning point of 85 degrees Centigrade in FIG. 8, there is a change in frequency with a change in temperature. In other words, the frequency response line has a large or steep slope.

In order to use the integrated circuit IC1 that was designed for use with both an AT-cut crystal and an SC-cut crystal and obtain good frequency response over temperature, the integrated circuit must be compensated, tricked or provided with the illusion that it is operating at another temperature, when in reality it is not.

Integrated circuit IC1 is adjusted to operate around the 60 degree point in FIG. 8 by the selection of resistors R1 and R2 in FIG. 2 such that the voltage generated at node N1 or terminal TE1 is approximately 1.15 volts as shown in FIG. 8. This voltage would typically be about 1.0 volts for use with an AT-cut crystal as shown by the value of 1.0 volts located at the tuning point in FIG. 8.

The present invention provides the illusion to integrated circuit IC1 that the resonator 102 is operating at the turning point 804 of an AT-cut quartz crystal, when in reality the resonator 102 is operating at the turning point 702 of an SC-cut quartz crystal.

This allows the use of an integrated circuit designed for an AT-cut crystal to be used with an SC-cut crystal. There are many advantages to this design. It avoids the need to design a new integrated circuit specifically for use with an SC-cut crystal and is lower in cost, since AT-cut crystals are used in higher volume applications than SC-cut crystals.

First Alternative Oscillator Circuit

Figure 3:
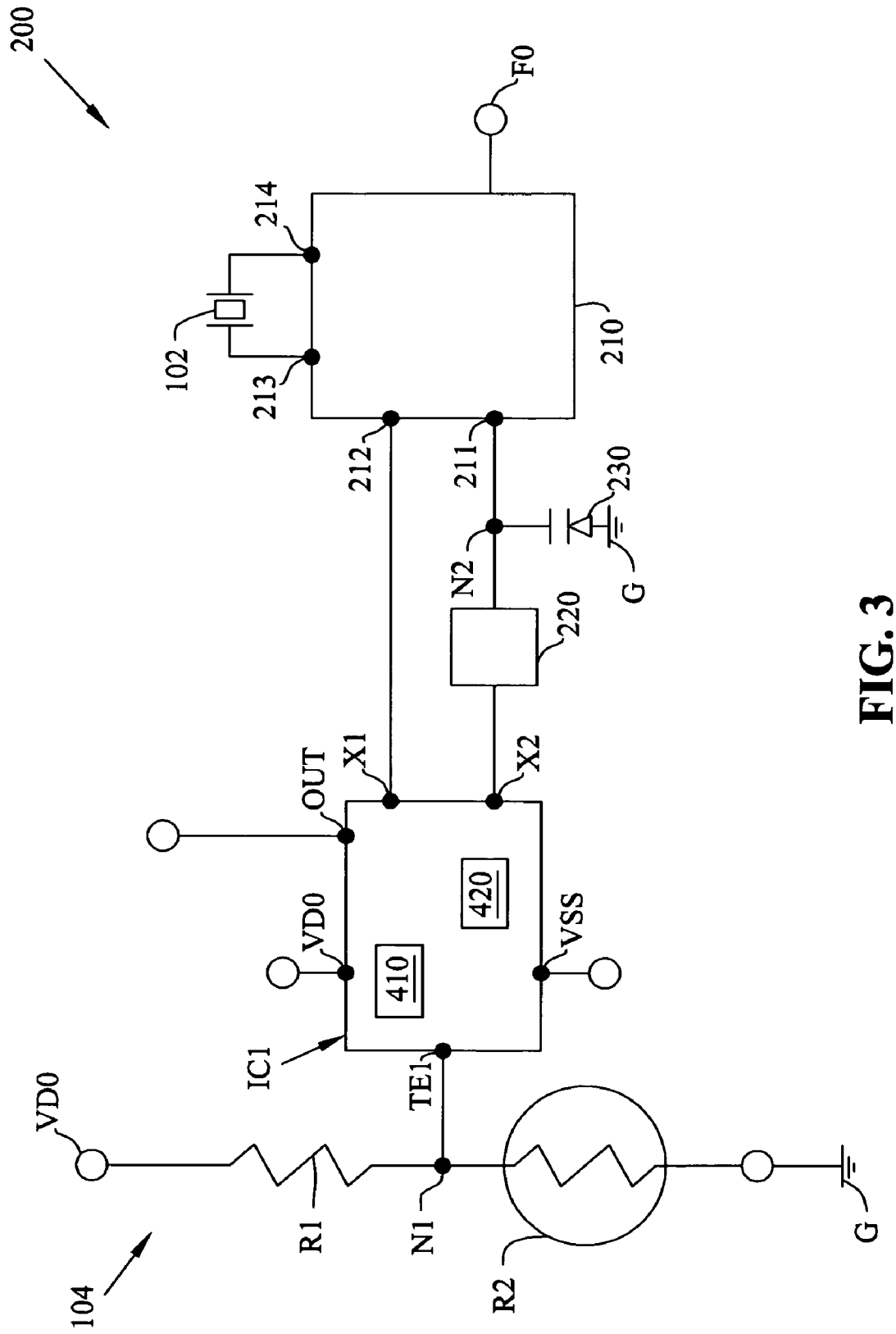
FIG. 3 is a schematic view of another embodiment of a TCXO in accordance with the present invention.

Referring to FIG. 3, a schematic diagram of another embodiment of a temperature compensated crystal oscillator (TCXO) 200 is shown. TCXO 200 can replace or be used for TCXO 50 of FIG. 1.

Figure 4:
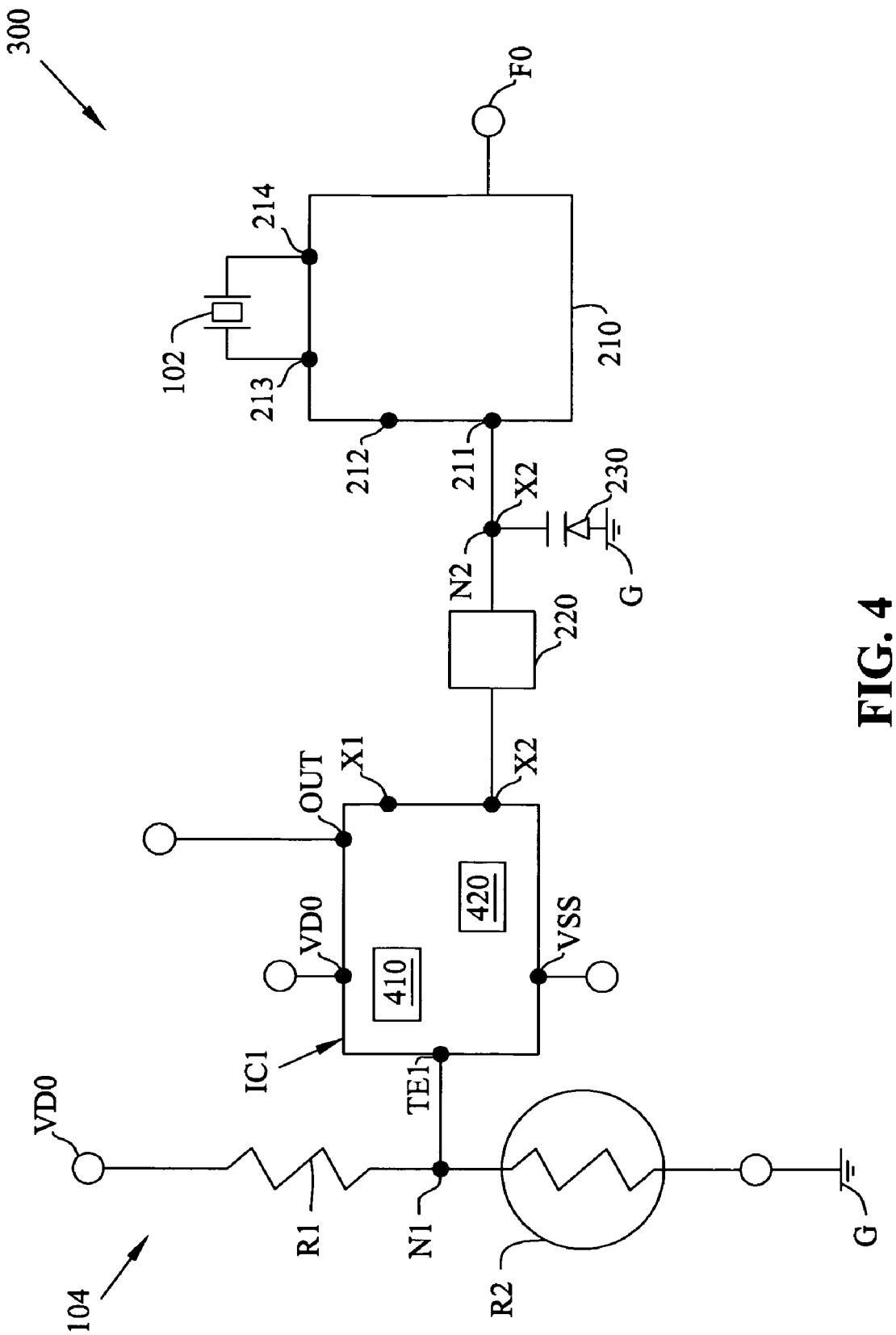
FIG. 4 is a schematic view of an additional embodiment of a TCXO in accordance with the present invention.

TCXO 200 is similar to TCXO 100 except that a separate external oscillator circuit 210, low pass filter 220 and varactor diode 230 have been added. In FIG. 4, oscillator circuit 410, internal to integrated circuit IC1, is not used.

Oscillator circuit 210 is connected with crystal terminals X1 and X2. In FIG. 3, the internal oscillator circuit of integrated circuit IC1 is not used and is bypassed by the use of oscillator circuit 210. Oscillator circuit 210 can be a conventional oscillator circuit such as a Pierce or Colpitts oscillator circuit as will be discussed later in FIG. 6. Oscillator circuit 210 has terminals 211, 212, 213, 214 and Fo. Terminal 212 is connected to crystal terminal X1. Terminals 213 and 214 are connected across resonator 102. Terminal Fo is the output frequency terminal.

A varactor diode 230 is connected between ground and node N2. Varactor diode 230 has an adjustable capacitance that can be used to tune the operating frequency of the oscillator. Node N2 is connected with terminal 211. A low pass filter 220 is connected between node N2 and terminal X2. Low pass filter 220 delays the correction voltage supplied to varactor diode 230 to better match the thermal profile of crystal resonator 102.

During the operation of the oscillator with TCXO 200, oven 12 is maintained at a substantially constant temperature by sensor 22, heater 18 and control circuit 20. Oscillator circuit 210 produces the reference frequency that is stabilized by resonator 102. Oscillator circuit 410 is not used.

Temperature sensor 104 generates a temperature signal that is proportional to the temperature to which resonator 102 is exposed. Integrated circuit IC1 contains the temperature compensation circuit 420 that uses the temperature signal to adjust the reference frequency that is produced at terminal Fo. The temperature compensation circuit 420 maintains the reference frequency within a tight tolerance. Integrated circuit IC1 operates the same as previously discussed for TCXO 100.

Figure 6:
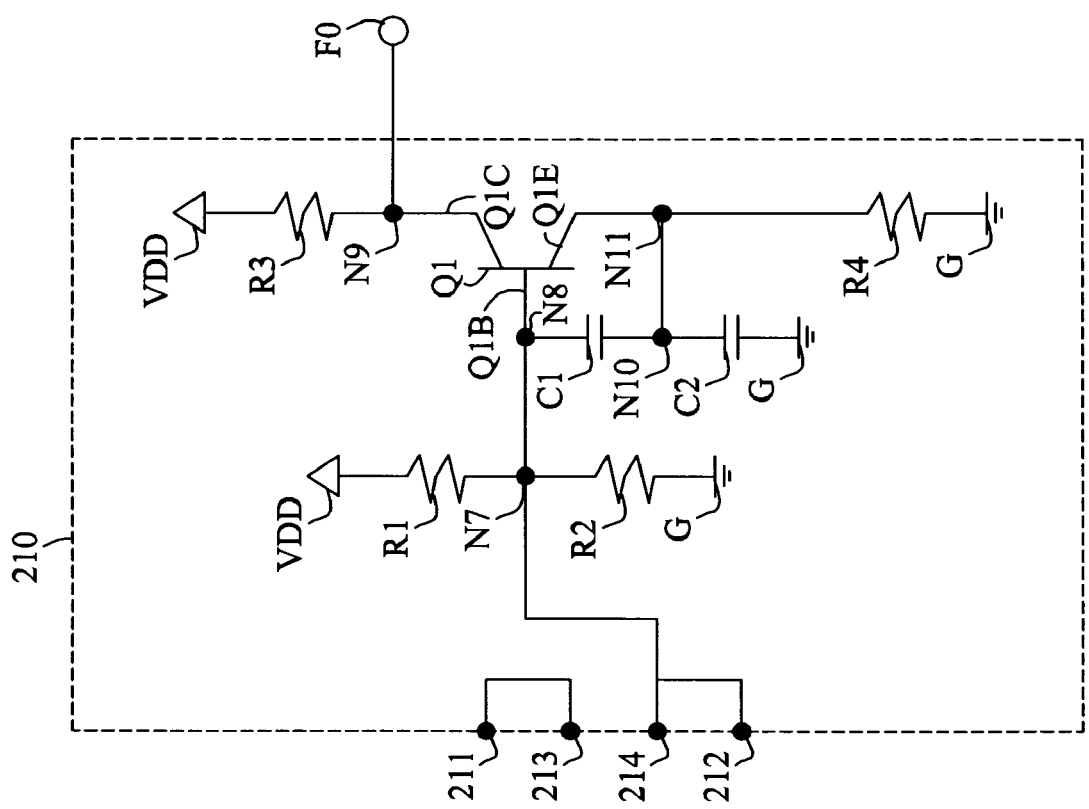
FIG. 6 is a schematic view of a Colpitts oscillator circuit.

Referring to FIG. 6, a Colpitts oscillator circuit 210 is shown. Oscillator circuit 210 includes a transistor Q1 that has a base Q1B, a collector Q1C and an emitter Q1E. Base Q1B is connected to node N8. Collector Q1C is connected to node N9 and resistor R3, which is connected to power supply Vdd. Node N9 is further connected to output terminal Fo. Emitter Q1E is connected to Node N11, which is connected to resistor R4. Resistor R4 is further connected to ground G. Capacitor C1 is connected between node N8 and node N10. Capacitor C2 is connected between node N10 and ground.

Resistor R1 is connected between node N7 and power supply Vdd. Resistor R2 is connected between node N7 and ground. Node N7 is connected to terminals 212 and 214.

Second Alternative Oscillator Circuit Referring to FIG. 4, a schematic diagram of another embodiment of a temperature compensated crystal oscillator (TCXO) 300 is shown. TCXO 300 can replace or be used for TCXO 50 of FIG. 1.

TCXO 300 is similar to TCXO 200 except that the connection between terminal X1 and terminal 212 has been eliminated.

Integrated Circuit

Figure 5:
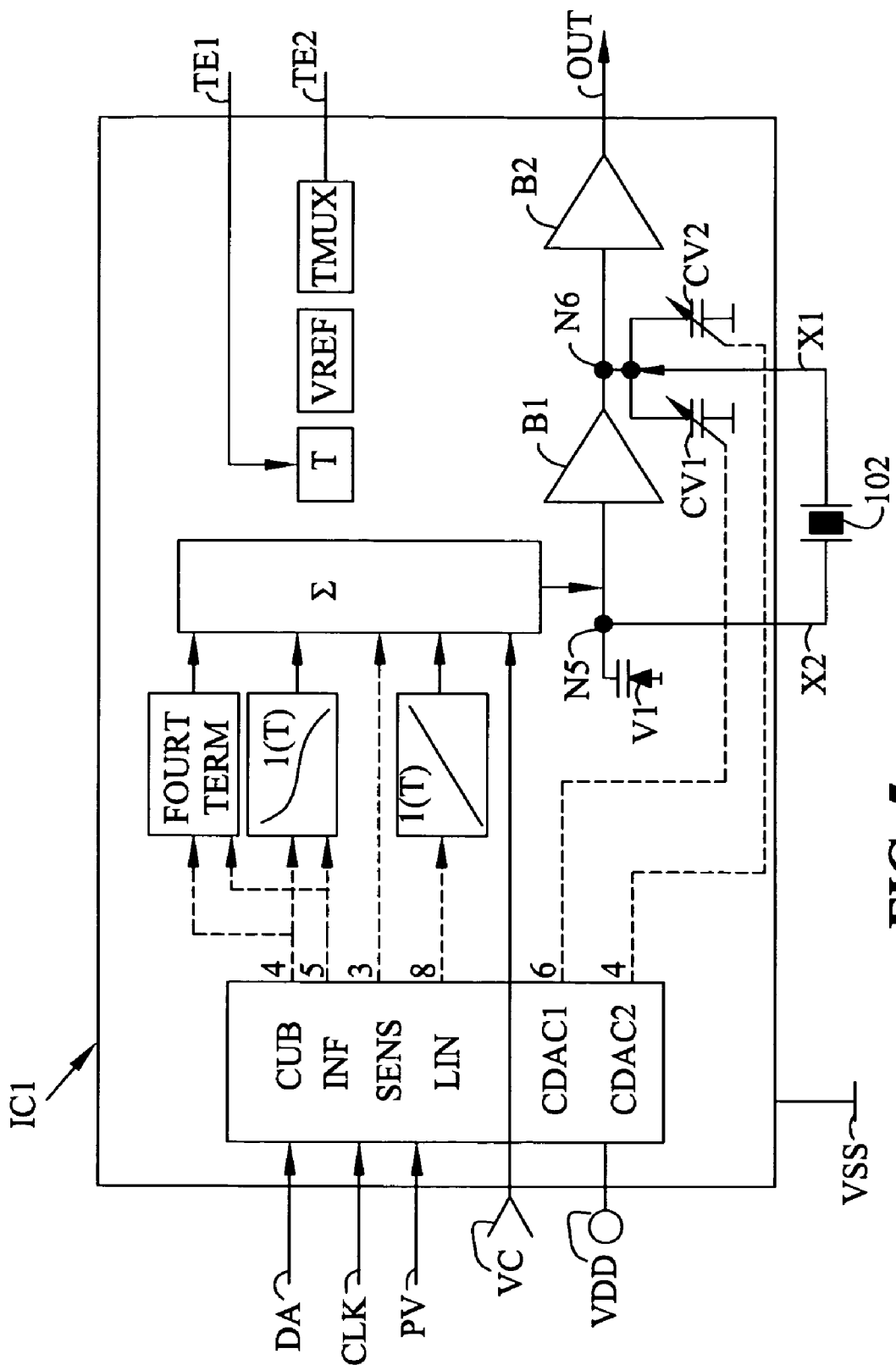
FIG. 5 is a schematic view of the integrated circuit of FIGS. 2 and 3.

Referring to FIG. 5, a block diagram of integrated circuit IC1 is shown. Integrated circuit IC1 includes a power supply terminal Vdd that provides power to the chip. Programming input terminal PV is used for programming the temperature compensation registers after they have been calibrated. Clock input terminal CLK is used only during calibration. Data input terminal DA provides digital serial data to the internal registers.

Temperature input/output terminal TE1 can provide an output voltage from the internal temperature sensor T or can accept an externally generated temperature-sensitive voltage. In the present invention, the voltage at terminal TE1 is set such that integrated circuit IC1 can be used with an SC-cut quartz crystal. Test multiplexer output terminal TE2 is used for testing IC1. Voltage control input terminal VC is used to tune the varactor voltage to the respective frequency within the application. Crystal terminals X1, and crystal/varactor terminal X2 can be connected with a resonator. Ground terminal Vss is connected to ground. Buffer output terminal Out provides an output frequency.

Several internal circuits and registers are contained within integrated circuit IC1. Cubic register CUB sets the scaling of the cubic control voltage part of the varactor control voltage. The inflection point register INF sets the inflection point of the cubic control voltage of the varactor control voltage. The sensitivity register SENS sets the scaling of the overall varactor control voltage. The linear compensation register LIN sets the slope of the varactor control voltage. The CDAC1 fine offset compensation register compensates the crystal offset by changing the load capacitance through variable capacitor CV1. The CDAC2 offset compensation register is used for coarse tuning of the output frequency by changing the load capacitance through variable capacitor CV2.

The values of the cubic, inflection point, sensitivity and linear registers are summed in the summing register Σ. The output of the summing register is provided to node N5 as a compensation voltage. Node N5 is connected to terminal X2, the input of buffer B1 and varactor diode V1. Node N6 is connected to the output of buffer B1, variable capacitors CV1 and CV2 and the input of buffer B2. Terminals X1 and X2 can be connected to resonator 102.

Method of Operation

Figure 9:
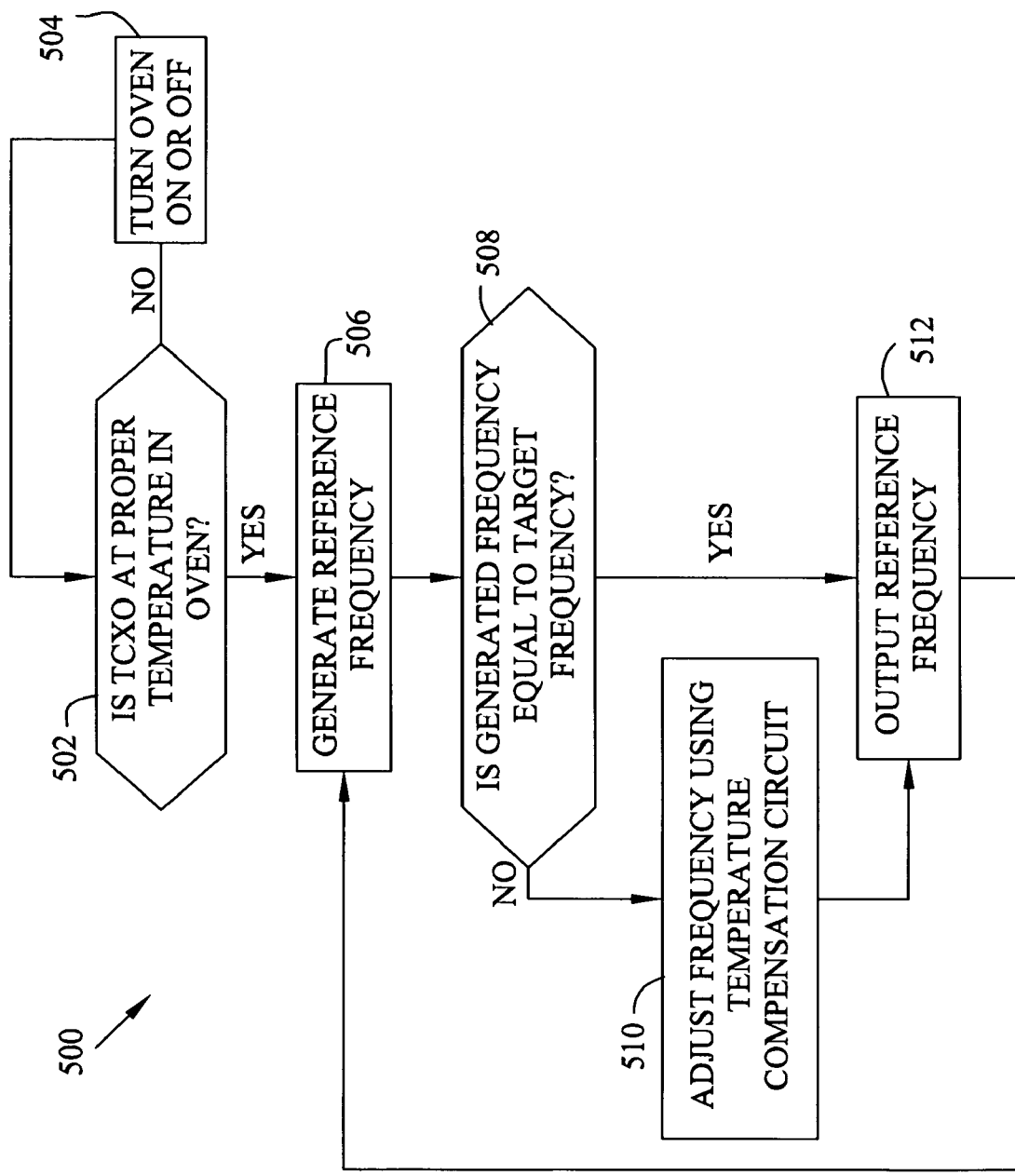
FIG. 9 is a flowchart of a method of operating an oscillator in accordance with the present invention.

Turning now to FIGS. 1 and 9, a method of operating an oscillator in accordance with the present invention is shown. Method 500 includes decision step 502. At decision step 502, the control circuit 20 checks to see if the TCXO 50 is at the proper temperature. If the oven 12 is not at the correct temperature, method 500 proceeds to step 504 where the heater 18 is turned on or off depending upon the temperature. After the oven reaches the proper temperature, step 504 returns to decision 502 to confirm the proper temperature of the oven.

If the oven is at the correct temperature, method 500 proceeds to step 506 where the reference frequency is generated by the TCXO 50. Next, the generated frequency is compared to the target frequency at decision step 508. If the generated frequency is equal to the target frequency, the reference frequency is outputted or provided at step 512. If the generated frequency is not equal to the target frequency, method 500 proceeds to step 510. At step 510, the generated frequency is adjusted by TCXO 50. The resulting reference frequency is outputted or provided at step 512.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An oscillator comprising:
   a resonator having a first turning point;
   a first oscillator circuit in communication with the resonator and operable to produce a reference frequency;
   a temperature compensation circuit in communication with the first oscillator circuit, the temperature compensation circuit configured to adjust the reference frequency at a second turning point; and
   a first temperature sensor circuit in communication with the temperature compensation circuit;
   a second temperature sensor circuit in communication with the temperature compensation circuit, the second temperature sensor circuit rather than the first temperature sensor circuit generating a temperature signal that is used by the temperature compensation circuit to adjust the reference frequency at the first turning point instead of the second turning point.

2. The oscillator according to claim 1, wherein the second temperature sensor circuit comprises a thermistor and a resistor, the resistor being connected to a first voltage source, the thermistor being connected to ground, the thermistor and the resistor further being connected to the temperature compensation circuit.

3. The oscillator according to claim 2, wherein the first oscillator circuit is bypassed and further comprising a second oscillator circuit located between and in communication with the temperature compensation circuit and the resonator, the second oscillator circuit comprising:
   a transistor having a base, an emitter and a collector;
   a second resistor connected to a second voltage source;
   a third resistor connected to ground;
   a fourth resistor connected between the second voltage source and the collector;
   a fifth resistor connected between the emitter and ground; and
   a first and second capacitor coupled between the base and ground.

4. The oscillator according to claim 1, wherein the temperature compensation circuit is located within an integrated circuit.

5. The oscillator according to claim 1, further comprising an oven containing the resonator, the first oscillator circuit, the temperature compensation circuit and the first and second temperature sensor circuits.

6. The oscillator according to claim 1, wherein the resonator is a SC-cut crystal and the temperature compensation circuit is configured to adjust the reference frequencies of an AT-cut crystal.

7. The oscillator according to claim 6, wherein the first turning point occurs at approximately 85 degrees Centigrade.

8. An oscillator comprising:
   an oscillator circuit;
   a resonator connected with the oscillator circuit, the resonator having an associated first change in frequency with temperature response;
   a temperature compensation circuit in communication with the oscillator circuit, the temperature compensation circuit being adapted to adjust a reference frequency generated by the oscillator circuit according to a second change in frequency with temperature response; and
   an adjustment circuit in communication with the temperature compensation circuit, the adjustment circuit being adapted to generate at least one voltage and to provide the at least one voltage to the temperature compensation circuit such that the temperature compensation circuit shifts operation from the second change in frequency with temperature response to the first change in frequency with temperature response associated with the resonator, wherein the adjustment circuit comprises a thermistor having a first end and a second end and a first resistor having a third end and a fourth end, the first end being connected to a voltage source, the second end connected to the third end and the fourth end connected to ground, the second and third ends further being connected to the temperature compensation circuit.

9. The oscillator according to claim 8, wherein the adjustment circuit generates a temperature dependent voltage.

10. An oscillator comprising:
    an oscillator circuit;
    a resonator connected with the oscillator circuit, the resonator having an associated first change in frequency with temperature response;
    a temperature compensation circuit in communication with the oscillator circuit, the temperature compensation circuit being adapted to adjust a reference frequency generated by the oscillator circuit according to a second change in frequency with temperature response; and an adjustment circuit in communication with the temperature compensation circuit, the adjustment circuit being adapted to generate at least one voltage and to provide the at least one voltage to the temperature compensation circuit such that the temperature compensation circuit shifts operation from the second change in frequency with temperature response to the first change in frequency with temperature response associated with the resonator, wherein the adjustment circuit provides the temperature compensation circuit with the illusion that the temperature compensation circuit is operating at another temperature.

11. An oscillator, comprising:

a resonator having a first turning point;

an integrated circuit including:

a first oscillator circuit in communication with the resonator for producing a reference frequency;

a temperature compensation circuit in communication with the first oscillator circuit for adjusting the reference frequency in response to changes in temperature, the temperature compensation circuit designed to adjust the reference frequency at a second turning point different than the first turning point; and a first temperature sensor circuit in communication with the temperature compensation circuit;

a second temperature sensor circuit in communication with the temperature compensation circuit and external to the integrated circuit, the second temperature sensor circuit rather than the first temperature sensor circuit generating a temperature signal that is used by the temperature compensation circuit to adjust the reference frequency at the first turning point rather than the second turning point.

12. The oscillator according to claim 11, wherein the oscillator is mounted in an oven.

13. The oscillator according to claim 11, wherein the second temperature sensor circuit comprises a thermistor and a first resistor.

14. The oscillator according to claim 11, wherein the first oscillator circuit is bypassed and further comprising a second oscillator circuit external to the integrated circuit and located between and in communication with the integrated circuit and the resonator.

15. The oscillator according to claim 11, wherein the resonator is a SC cut crystal and the integrated circuit is designed to adjust the reference frequency of an AT-cut crystal.

* * * * *